United States Patent
Tsien et al.

(10) Patent No.: US 10,861,504 B2
(45) Date of Patent: Dec. 8, 2020

(54) DYNAMIC CONTROL OF MULTI-REGION FABRIC

(71) Applicant: Advanced Micro Devices, Inc., Sunnyvale, CA (US)

(72) Inventors: Benjamin Tsien, Fremont, CA (US); Alexander J. Branover, Chestnut Hill, MA (US); Alan Dodson Smith, Austin, TX (US); Chintan S. Patel, Bee Cave, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/725,912

(22) Filed: Oct. 5, 2017

(65) Prior Publication Data

US 2019/0108861 A1 Apr. 11, 2019

(51) Int. Cl.
*G11C 5/06* (2006.01)
*G06F 1/3296* (2019.01)
(Continued)

(52) U.S. Cl.
CPC .............. *G11C 5/06* (2013.01); *G06F 1/3203* (2013.01); *G06F 1/3253* (2013.01);
(Continued)

(58) Field of Classification Search
CPC ................................... G11C 5/06; G11C 5/02
(Continued)

(56) References Cited

U.S. PATENT DOCUMENTS

| 4,760,515 A | 7/1988 | Malmquist et al. |
| 5,553,223 A | 9/1996 | Greenlee et al. |

(Continued)

FOREIGN PATENT DOCUMENTS

| WO | 96/38791 A1 | 12/1996 |
| WO | 00/31925 A1 | 6/2000 |

OTHER PUBLICATIONS

Smith et al., U.S. Appl. No. 15/728,191, entitled "Method and Apparatus for In-Band Priority Adjustment Forwarding in a Communication Fabric", filed Oct. 9, 2017, 29 pages.

(Continued)

*Primary Examiner* — Muna A Techane
(74) *Attorney, Agent, or Firm* — Kowert Hood Munyon Rankin and Goetzel PC; Rory D. Rankin

(57) ABSTRACT

Systems, apparatuses, and methods for implementing dynamic control of a multi-region fabric are disclosed. A system includes at least one or more processing units, one or more memory devices, and a communication fabric coupled to the processing unit(s) and memory device(s). The system partitions the fabric into multiple regions based on different traffic types and/or periodicities of the clients connected to the regions. For example, the system partitions the fabric into a stutter region for predictable, periodic clients and a non-stutter region for unpredictable, non-periodic clients. The system power-gates the entirety of the fabric in response to detecting a low activity condition. After power-gating the entirety of the fabric, the system periodically wakes up one or more stutter regions while keeping the other non-stutter regions in power-gated mode. Each stutter region monitors stutter client(s) for activity and processes any requests before going back into power-gated mode.

20 Claims, 7 Drawing Sheets

(51) Int. Cl.
*G06F 13/40* (2006.01)
*G06F 1/3234* (2019.01)
*G06F 1/3203* (2019.01)
*G06F 1/3287* (2019.01)
*G11C 5/02* (2006.01)
*G11C 5/14* (2006.01)

(52) U.S. Cl.
CPC .......... *G06F 1/3287* (2013.01); *G06F 1/3296* (2013.01); *G06F 13/4022* (2013.01); *G11C 5/02* (2013.01); *G11C 5/14* (2013.01); *G11C 5/148* (2013.01)

(58) Field of Classification Search
USPC .......................................................... 365/63
See application file for complete search history.

(56) References Cited

U.S. PATENT DOCUMENTS

| | | | |
|---|---|---|---|
| 5,706,502 | A | 1/1998 | Foley et al. |
| 5,761,513 | A | 6/1998 | Yellin et al. |
| 5,815,653 | A | 9/1998 | You et al. |
| 5,923,885 | A | 7/1999 | Johnson et al. |
| 6,058,393 | A | 5/2000 | Meier et al. |
| 6,119,247 | A | 9/2000 | House et al. |
| 6,138,140 | A | 10/2000 | Yokote |
| 6,618,854 | B1 | 9/2003 | Mann |
| 7,394,290 | B2 * | 7/2008 | Seo .................. H03K 19/0016 326/81 |
| 7,596,647 | B1 | 9/2009 | Van Dyke et al. |
| 8,448,001 | B1 | 5/2013 | Zhu et al. |
| 9,529,400 | B1 | 12/2016 | Kumar et al. |
| 9,594,621 | B1 | 3/2017 | Navilappa |
| 9,886,414 | B2 | 2/2018 | Yun et al. |
| 9,971,700 | B2 * | 5/2018 | Loh ..................... G06F 12/10 |
| 9,983,652 | B2 * | 5/2018 | Piga ................... G06F 1/3203 |
| 10,067,796 | B1 | 9/2018 | Metcalf |
| 2002/0176306 | A1 * | 11/2002 | Abe ....................... G11C 29/50 365/226 |
| 2003/0035371 | A1 | 2/2003 | Reed et al. |
| 2003/0172149 | A1 | 9/2003 | Edsall et al. |
| 2003/0191857 | A1 | 10/2003 | Terrell et al. |
| 2004/0093404 | A1 | 5/2004 | Snyder et al. |
| 2005/0198459 | A1 | 9/2005 | Bogin et al. |
| 2005/0228531 | A1 | 10/2005 | Genovker et al. |
| 2006/0109829 | A1 | 5/2006 | O'Neill |
| 2006/0165115 | A1 | 7/2006 | Warren et al. |
| 2006/0171329 | A1 * | 8/2006 | Ying .................. H02J 13/00002 370/254 |
| 2008/0120441 | A1 | 5/2008 | Loewenstein |
| 2008/0126750 | A1 * | 5/2008 | Sistla .................. G06F 12/0831 712/30 |
| 2009/0016355 | A1 | 1/2009 | Moyes |
| 2009/0168782 | A1 | 7/2009 | Beshai |
| 2010/0211720 | A1 | 8/2010 | Satpathy et al. |
| 2011/0035529 | A1 | 2/2011 | Wang et al. |
| 2011/0119526 | A1 * | 5/2011 | Blumrich .......... G06F 15/17381 714/16 |
| 2011/0138098 | A1 | 6/2011 | Satpathy et al. |
| 2011/0219208 | A1 * | 9/2011 | Asaad ................. G06F 12/0862 712/12 |
| 2012/0059962 | A1 | 3/2012 | Lai |
| 2012/0072563 | A1 | 3/2012 | Johnsen et al. |
| 2012/0221767 | A1 | 8/2012 | Post et al. |
| 2014/0192583 | A1 * | 7/2014 | Rajan ....................... G11C 7/10 365/63 |
| 2014/0201471 | A1 | 7/2014 | Cutter et al. |
| 2014/0281083 | A1 | 9/2014 | Canepa et al. |
| 2015/0120978 | A1 * | 4/2015 | Kalyanasundharam ..................... G06F 12/1009 710/267 |
| 2015/0220460 | A1 | 8/2015 | Litch et al. |
| 2015/0269396 | A1 | 9/2015 | Grafton |
| 2016/0094435 | A1 | 3/2016 | Goss et al. |
| 2016/0127191 | A1 | 5/2016 | Nair |
| 2016/0188473 | A1 | 6/2016 | Kruckemyer et al. |
| 2016/0191420 | A1 | 6/2016 | Nagarajan et al. |
| 2016/0210381 | A1 | 7/2016 | Singleton et al. |
| 2016/0323161 | A1 | 11/2016 | Cuervo Laffaye et al. |
| 2016/0378168 | A1 | 12/2016 | Branover et al. |
| 2017/0230733 | A1 | 8/2017 | Rana et al. |
| 2017/0339106 | A1 | 11/2017 | Rimmer et al. |
| 2018/0048562 | A1 | 2/2018 | Meyer |
| 2018/0063016 | A1 | 3/2018 | Gulati et al. |
| 2018/0067775 | A1 | 3/2018 | Frandzel et al. |
| 2019/0199617 | A1 | 6/2019 | Kalyanasundharam et al. |

OTHER PUBLICATIONS

International Search Report and Written Opinion in International Application No. PCT/US2018/051782, dated Jan. 4, 2019, 14 pages.
Non-Final Office Action in U.S. Appl. No. 15/850,616, dated Mar. 14, 2019, 12 pages.
Final Office Action in U.S. Appl. No. 15/850,616, dated Jul. 23, 2019, 14 pages.
International Search Report and Written Opinion in International Application No. PCT/US2018/051542, dated Dec. 12, 2018, 12 pages.
Non-Final Office Action in U.S. Appl. No. 15/728,191, dated Mar. 6, 2019, 29 pages.
Notice of Allowance in U.S. Appl. No. 15/728,191, dated Oct. 9, 2019, 10 pages.
Final Office Action in U.S. Appl. No. 15/850,616, dated Jun. 16, 2020, 19 pages.
Non-Final Office Action in U.S. Appl. No. 15/850,616, dated Feb. 27, 2020, 15 pages.

* cited by examiner

DYNAMIC CONTROL OF MULTI-REGION FABRIC

BACKGROUND

Description of the Related Art

Computing systems are increasingly integrating large numbers of different types of components on a single chip or on multi-chip modules. The complexity and power consumption of a system increases with the number of different types of components. Often, these components are connected together via switches, routers, communication buses, bridges, buffers, controllers, coherent devices, and other links. The combination of these interconnecting components is referred to herein as a "communication fabric", or "fabric" for short. Generally speaking, the fabric facilitates communication by routing messages between a plurality of components on an integrated circuit (i.e., chip) or multi-chip module. Examples of messages communicated over a fabric include memory access requests, status updates, data transfers, coherency probes, coherency probe responses, and the like.

Power management is an important aspect of the design and operation of integrated circuits, especially those circuits that are integrated within mobile devices. Mobile devices typically rely on battery power, and reducing power consumption in the integrated circuits can increase the life of the battery as well as decrease the heat generated by the integrated circuits. Accordingly, improved techniques for designing and managing a communication fabric within integrated circuits are desired.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for implementing dynamic control of a multi-region fabric are disclosed herein. In one embodiment, a system includes at least one or more processing units, one or more input/output (I/O) interfaces, a multi-region fabric, and one or more memory devices. The multi-region fabric is partitioned into multiple regions, with each region corresponding to a different power-gating domain. In various embodiments, a power-grating domain may be power gated independently of other power-gating domains. In one embodiment, the fabric is partitioned into at least a first region and a second region, with the first region classified as a stutter region and the second region classified as a non-stutter region. The stutter region refers to fabric components servicing predictable, periodic clients and the non-stutter region refers to fabric components servicing unpredictable, non-periodic clients. The traffic generated by clients in the stutter region is referred to as "stutter traffic". Stutter traffic includes traffic generated by long duration workloads such as during a static screen, playback, or others. Non-stutter traffic includes traffic generated by workloads such as keyboard/mouse responses, background processes, intensive central processing unit (CPU) or graphics processing unit (GPU) compute tasks, or others. Short duration battery-conscious non-stutter traffic allows enough idleness for entry into power-gating mode while long duration non-stutter traffic would prevent the fabric from entering power-gating mode. The fabric can also include any number of other regions in other embodiments. In one embodiment, when a power-gating condition is detected, all regions of the fabric are power-gated. Then, the fabric periodically turns on the stutter region to process any requests from the stutter client(s) while maintaining the non-stutter region in power-gated mode. In one embodiment, the fabric stores some state for the stutter region to make the transition out of power-gating mode and into power-on mode faster.

Figure 1:
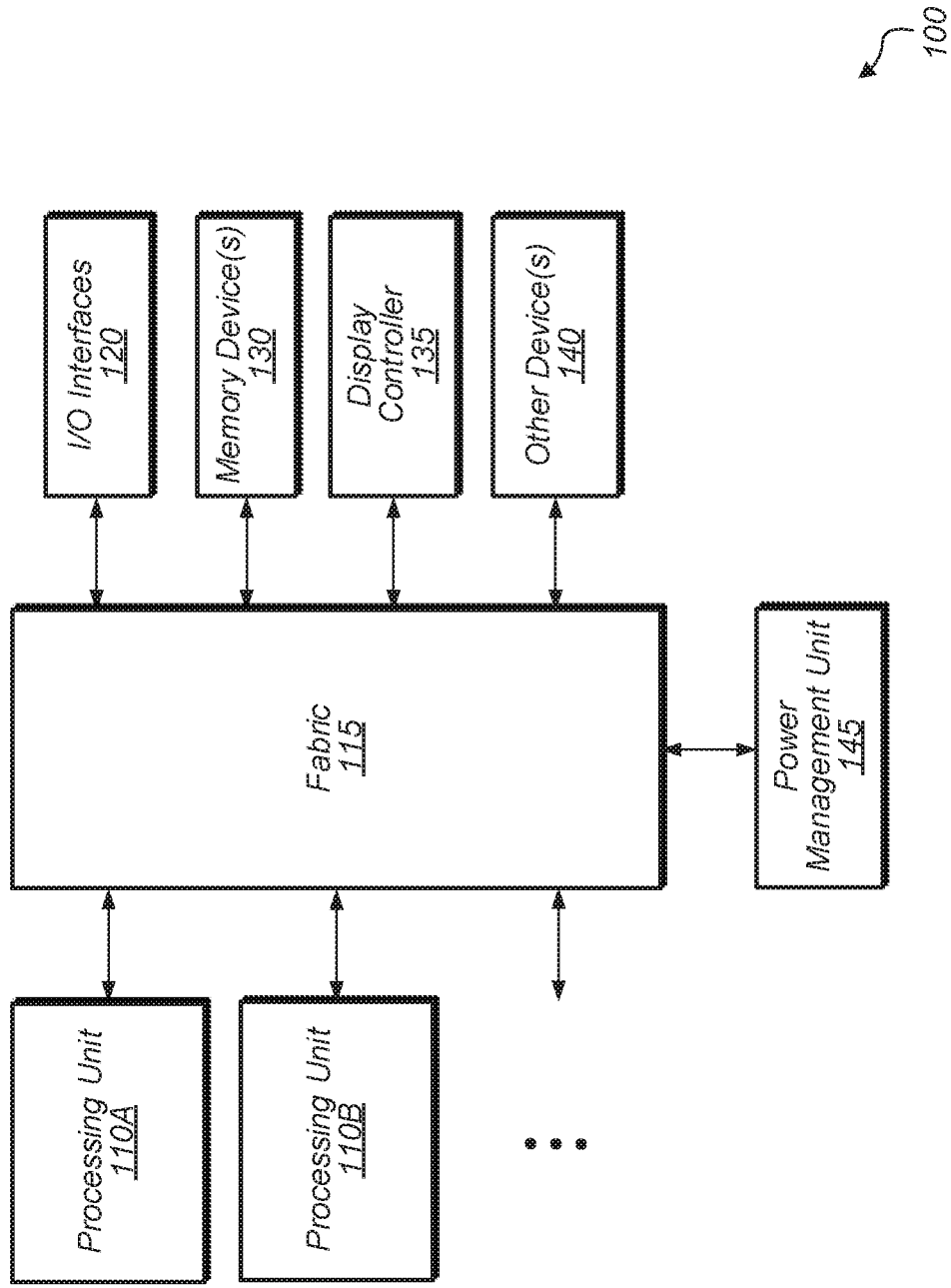
FIG. 1 is a block diagram of one embodiment of a computing system.

Referring now to FIG. 1, a block diagram of one embodiment of a computing system 100 is shown. In one embodiment, computing system 100 includes at least processing units 110A-B, fabric 115, input/output (I/O) interfaces 120, memory device(s) 130, display controller 135, other device(s) 140, and power management unit 145. In other embodiments, computing system 100 can include other components and/or computing system 100 can be arranged differently. Processing units 110A-B are representative of any number and type of processing units. For example, in one embodiment, processing unit 110A is a central processing unit (CPU) and processing unit 110B is a graphics processing unit (GPU). In other embodiments, processing units 110A-B can include other numbers and types of processing units (e.g., digital signal processor (DSP), field programmable gate array (FPGA), application specific integrated circuit (ASIC)).

Fabric 115 is representative of any communication interconnect and any protocol utilized for communicating among the components of the system 100. Fabric 115 provides the data paths, switches, routers, and other logic that connect the processing units 110A-B, I/O interfaces 120, memory device(s) 130, display controller 135, and other device(s) 140 to each other. Fabric 115 handles the request, response, and data traffic, as well as probe traffic to facilitate coherency. Fabric 115 also handles interrupt request routing and configuration access paths to the various components of system 100. Additionally, fabric 115 handles configuration requests, responses, and configuration data traffic. Fabric 115 can be bus-based, including shared bus configurations, crossbar configurations, and hierarchical buses with bridges. Fabric 115 can also be packet-based, and can be hierarchical with bridges, crossbar, point-to-point, or other interconnects. From the point of view of fabric 115, the other components of system 100 can be referred to as "clients". Fabric 115 is configured to process requests generated by various clients and pass the requests on to other clients.

In one embodiment, fabric 115 is partitioned into a plurality of regions, with each region representing a different power-gating domain. For example, in one embodiment, a first region is a stutter region which processes unpredictable and/or non-periodic clients and a second region is a non-stutter region which processes predictable and/or periodic clients. In this embodiment, when fabric 115 is power-gated, the stutter region of fabric 115 wakes up periodically to process requests from one or more clients while the non-stutter region remains power-gated. In other embodiments, fabric 115 can be partitioned into other numbers and types of regions representing different power-gating domains.

It is noted that the predictable and/or periodic clients can also be referred to as "stutter clients". Additionally, the region(s) of fabric 115 which process stutter clients can be referred to as "stutter region(s)". For example, a stutter client can be a client that generates a burst of requests targeting memory device(s) 130 and then goes into an idle mode following the burst of requests. Scenarios where stutter clients are active include static screen display scenarios, video playback scenarios, and other traffic generation behavior which is bursty followed by periods of idle behavior. For example, a video playback scenario involves decoding by dedicated engines and display controller 135 fetching decoded images from the frame buffer and outputting the images to the display. The video playback scenario can result in the stutter regions of fabric 115 being woken up periodically to handle the traffic from dedicated engines and display controller 135 and then the stutter regions of fabric 115 can return to the power-gated mode.

In general, fabric 115 is partitioned into a plurality of regions based on the different types of traffic being generated for the expected workloads or use cases of system 100. The partitioning of fabric 115 can be optimized for these expected workloads, such that the number of regions and the logic contained in each region will result in some portions of the fabric 115 remaining in power-gated mode while other portions of the fabric 115 are woken up periodically to service stutter clients. In some embodiments, fabric 115 can have a single stutter region while in other embodiments, fabric 115 can have multiple different stutter regions which wake up at different intervals. Portions of the fabric that need to wake up on similar intervals can be grouped together into a single stutter region. Other portions of the fabric that process unpredictable and/or non-periodic clients can be grouped together into the other region(s) which will remain power-gated while the stutter regions wake up on their different intervals. Non-stutter scenarios with activity by non-stutter clients include universal serial bus (USB) transfers, interrupts being processed by a CPU, an application being opened, direct memory access (DMA) transfers, and the like. In some cases, stutter clients do not necessarily need to be grouped into one of the stutter regions. For example, in one embodiment, a low frequency stutter client can be grouped with the non-stutter clients.

In one embodiment, power management unit 145 is configured to manage the power-gating of regions of fabric 115 and the waking up of stutter regions on a periodic basis. As used herein, the term "power-gate" is defined as reducing the power consumption of one or more components. The term "power-gate" can also be defined as putting a region or multiple regions of the fabric into a low power state. A "low power state" as defined herein can be a state in which a voltage supplied to the component(s) of the region is reduced from its maximum, a state in which the frequency of the clock signal is reduced, a state in which the clock signal is inhibited from the component(s) (clock-gated), one in which power is removed from the component(s), or a combination of any of the former.

In one embodiment, fabric 115 is configured to optimize the efficiency of the stutter regions entering and exiting a low power state. The efficiency of the stutter regions entering and exiting a low power state can also be referred to as "stutter efficiency". In one embodiment, fabric 115 optimizes the stutter efficiency by keeping some stored state (e.g., address map, routing table, configuration data) in an always-on state to reduce the latency of the stutter regions when transitioning between power states. By reducing the latency of transitions, the stutter regions of fabric 115 are able to spend more time in the power-gated state, allowing for increased power savings. Whether a region has data saved in always-on state can be based on how frequently the region wakes up. If the power savings of reduced latency is greater than the power lost due to saving the data in an always-on state, then fabric 115 can maintain stored state for the given stutter region.

Memory device(s) 130 are representative of any number and type of memory devices. For example, the type of memory in memory device(s) 130 can include Dynamic Random Access Memory (DRAM), Static Random Access Memory (SRAM), NAND Flash memory, NOR flash memory, Ferroelectric Random Access Memory (FeRAM), or others. Memory device(s) 130 are accessible by processing units 110A-B, I/O interfaces 120, display controller 135, and other device(s) 140 via fabric 115. I/O interfaces 120 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices can be coupled to I/O interfaces 120. Such peripheral devices include (but are not limited to) displays, keyboards, mice, printers, scanners, joysticks or other types of game controllers, media recording devices, external storage devices, network interface cards, and so forth. Other device(s) 140 are representative of any number and type of devices (e.g., multimedia device, video codec).

In various embodiments, computing system 100 can be a computer, laptop, mobile device, server or any of various other types of computing systems or devices. It is noted that the number of components of computing system 100 can vary from embodiment to embodiment. There can be more or fewer of each component than the number shown in FIG. 1. It is also noted that computing system 100 can include other components not shown in FIG. 1. Additionally, in other embodiments, computing system 100 can be structured in other ways than shown in FIG. 1.

Figure 2:
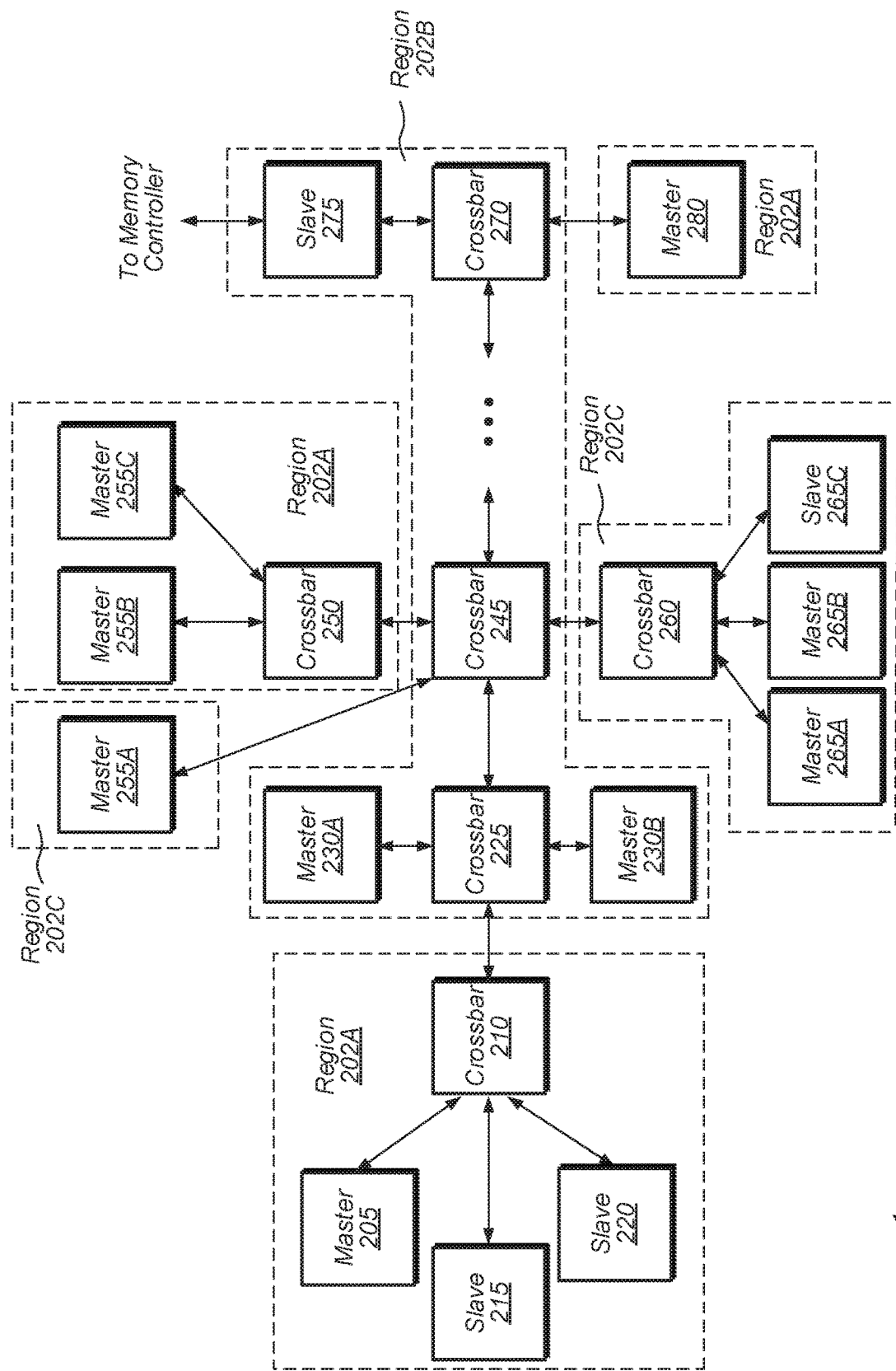
FIG. 2 is a block diagram of one embodiment of a multi-region fabric.

Turning now to FIG. 2, a block diagram of one embodiment of a multi-region fabric 200 is shown. In one embodiment, fabric 200 can be implemented as fabric 115 of computing system 100 (of FIG. 1). In one embodiment, fabric 200 is partitioned into a plurality of regions 202A-C. Regions 202A-C are representative of any number of regions, with any number of components per region and any type of topology for each region. As shown in FIG. 2, there are three separate regions 202A-C, although these regions 202A-C are scattered about the topology of fabric 200. In other words, a given region 202A-C does not have to be contiguous within fabric 200.

In one embodiment, each region 202A-C of fabric 200 is associated with a different power-gating domain. For example, region 202A is associated with a first power-gating domain, region 202B is associated with a second power-gating domain, and region 202C is associated with a third power-gating domain. In one embodiment, region 202C is a non-stutter region and region 202C is placed in a power-gated state for longer periods of time than regions 202A-B. In other embodiments, fabric 200 can include other numbers and types of regions, with each region associated with a separate power domain.

Each region 202A-C of fabric 200 includes one or more components that are included within the respective region. Region 202A includes master 205 and slaves 215 and 220 coupled to crossbar 210. As used herein, a "master" is defined as a component that generates requests, and a "slave" is defined as a component that services requests. Region 202A also includes crossbar 250, master 255B, and master 255C. Region 202A also includes master 280. In one embodiment, every dashed block of fabric 200 labeled as region 202A is included within a single power-gating domain of fabric 200. This power-gating domain is power-gated as a group, such that every component in a dashed block labeled as region 202A is power-gated together and is brought out of power-gating mode together.

Other components of fabric 200 are considered to be part of regions 202B-C. For example, crossbar 225, master 230A, master 230B, crossbar 245, crossbar 270, and slave 275 are included within region 202B. In one embodiment, slave 275 is coupled to a memory controller. In one embodiment, region 202B is treated as a stutter region, and the clients coupled to components in region 202B are referred to as "stutter clients". A stutter client is a client which exhibits predictable and/or periodic behavior such that traffic is generated on a periodic basis. In one embodiment, region 202C is also treated as a stutter region, although region 202C can have a different periodicity than region 202B. Region 202C includes master 255A. Region 202C also includes crossbar 260, masters 265A-B, and slave 265C. In one embodiment, when fabric 200 is placed into power-gating mode, regions 202A, 202B, and 202C are power-gated. Then, fabric 200 will turn region 202B back on periodically on a first periodic interval to process any pending requests from its stutter clients. Fabric 200 can also turn region 202C back on periodically on a second periodic interval to process any pending requests from its stutter clients. When fabric 200 turns region 202B or region 202C back on, fabric 200 keeps region 202A in the power-gated mode to reduce power consumption. Accordingly, region 202B or region 202C is powered on to process requests from stutter clients but region 202A remains in power-gated mode. This allows fabric 200 to continue to save some power by keeping some of fabric 200 in the power-gated mode while processing requests from stutter clients. An alternate approach in the prior art would be to power on the entire fabric 200 to process requests from stutter clients, but this would consume more power than the approaches described herein.

In another embodiment, fabric 200 can have other numbers of different stutter regions, and each stutter region of fabric 200 can be woken up at a different periodicity depending on the activity of the stutter clients coupled to the respective stutter region. For example, a first stutter region of fabric 200 can wake up every 100 milliseconds (ms) to process requests from stutter clients of the first stutter region, a second stutter region of fabric 200 can wake up every 16.67 ms to process requests from stutter clients of the second stutter region, a third stutter region of fabric 200 can wake up every 250 microseconds (µs) to process requests from stutter clients of the third stutter region, and so on. The amount of time that each stutter region stays in power-on mode can vary from region to region.

It is noted that the various crossbars 210, 225, 245, 250, 260, and 270 which are part of fabric 200 can also be referred to as switches or routers. A crossbar can include switch connections and buffering to buffer requests which are received by the crossbar. A crossbar can also include credit control logic to implement a flow control mechanism for transmitting requests from source to destination. Each crossbar allows for requests to connect from any source to any of the destinations coupled to the crossbar. Each crossbar also includes one or more connections to other crossbars to enable requests to be sent to other destinations which are not directly coupled to the respective crossbar.

Figure 3:
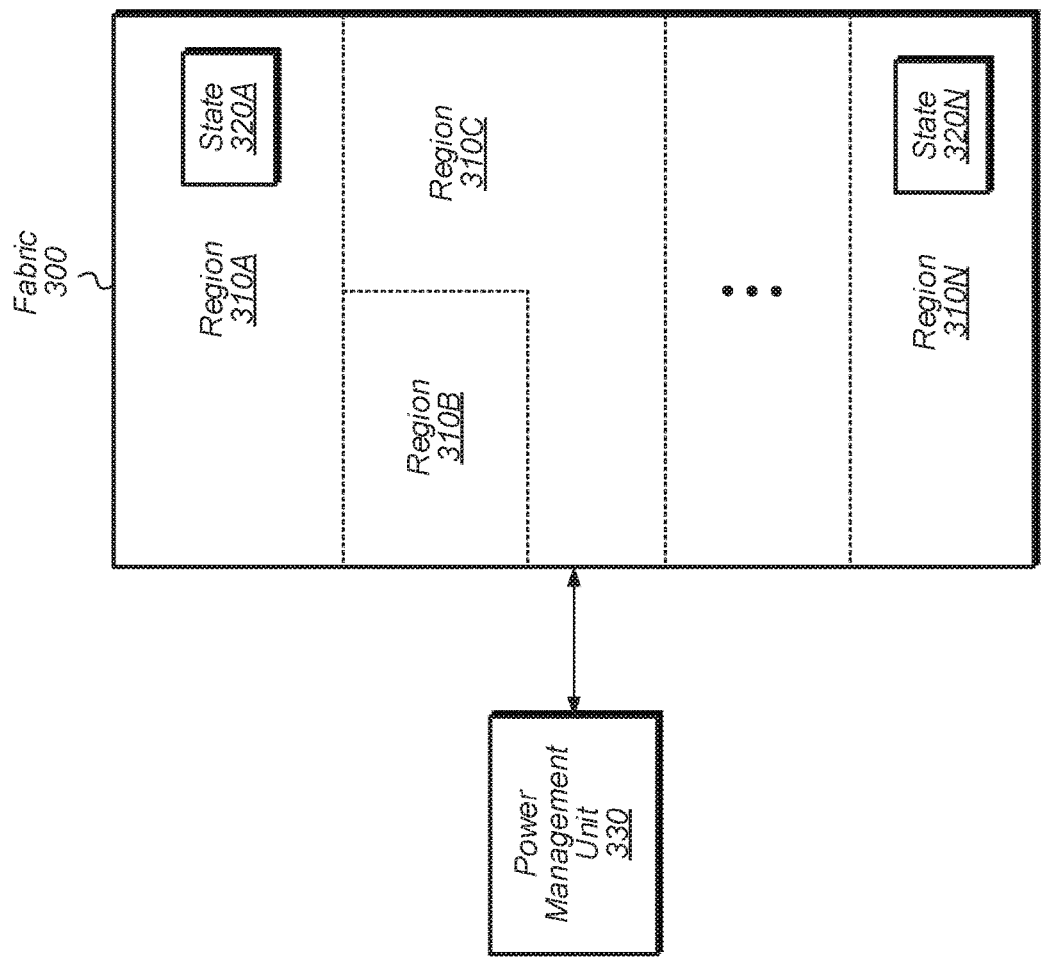
FIG. 3 is a block diagram of another embodiment of a multi-region fabric.

Referring now to FIG. 3, a block diagram of another embodiment of a multi-region fabric 300 is shown. In various embodiments, fabric 300 can be implemented as fabric 115 of system 100 (of FIG. 1) or as the communication fabric of other computer systems. In one embodiment, fabric 300 is partitioned into a plurality of regions 310A-N. The number and topology of regions 310A-N can vary according to the embodiment. The number of components per region 310A-N can also vary from region to region and from embodiment to embodiment. In general, one or more of regions 310A-N can be classified as stutter regions and the other regions 310A-N can be classified as non-stutter regions. The classification of regions as stutter or non-stutter regions can be determined based on the type of clients and/or the traffic types that are serviced by these regions.

In one embodiment, fabric 300 is partitioned into regions based on an analysis of the various types of clients within the host computing system and the predictability or unpredictability of their traffic generation behavior. For example, clients that generate requests at a common interval can be classified as a single group, and components of fabric 300 which process requests from this group of clients can be grouped together into a common region of fabric 300. When fabric 300 is power-gated, a given region can exit from the power-gated mode on a periodic basis to check for requests from their clients. Each region can utilize a different periodic basis for checking for requests from corresponding clients. The periodic basis which is utilized for checking for requests can also be determined based on an analysis of the host computing system and the expected workloads. The frequency with how often each region of fabric 300 is woken up to check for requests from their clients is programmable and can be dynamically adjusted by fabric 300 and/or the host system. In one embodiment, when multiple stutter clients with similar periodicity are grouped into the same stutter region, if one stutter client wakes up fabric 300, fabric 300 can notify one or more other clients that this region is no longer power-gated, allowing these other clients to also send their requests without incurring another power-gating transition penalty. This can help reduce the total number of transitions in a fixed amount of time, which increases the overall stutter efficiency of the stutter region. Likewise, the same technique can be applied to multi-stutter domains where a high frequency stutter region piggybacks on transitions caused by a low frequency stutter region to improve overall system low power residence.

In one embodiment, in order to reduce the latency of transitioning between power-gated mode and powered-on mode for certain regions, one or more regions store some saved state in always on flops to help make the transition occur more quickly. For example, region 310A includes state 320A, which is stored state for one or more of the components of region 310A. The stored state 320A can include address maps, routing tables, buffer allocation information, configuration data, and the like. Also, region 310N includes state 320N, which is stored state for one or more of the components of region 310N. Any number of other regions can also include some stored information to help reduce the time needed for transitioning between power-gated mode and powered-on mode.

In one embodiment, fabric 300 is coupled to power management unit 330. In another embodiment, power management unit 330 is included as part of fabric 300. In one embodiment, power management unit 330 is a partition-aware unit that recognizes the different regions of fabric 300 and manages each region independently of the other regions. In one embodiment, power management unit 330 is configured to control the power modes of the various regions 310A-N of fabric 300. For example, power management unit 330 puts one or more regions 310A-N into power-gated mode and periodically takes one or more regions 310A-N out of power-gated mode. To put a given region 310 into power-gated mode, power management unit 330 can reduce or shut off the supply voltage(s) and/or clock(s) being supplied to the given region 310. To bring a given region 310 out of power-gated mode, power management unit 330 can increase or turn on the supply voltage(s) and/or clock(s) being supplied to the given region 310. Power management unit 330 receives control signals from one or more other units, such as a timer, interrupt unit, processing unit, and the like, for determining when to transition between different power states for the various regions 310A-N of fabric 300.

Figure 4:
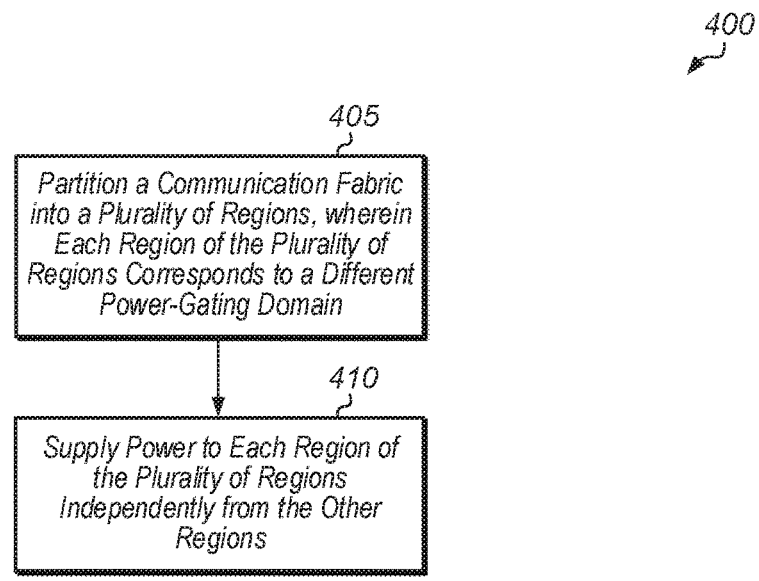
FIG. 4 is a generalized flow diagram illustrating one embodiment of a method for implementing a multi-region communication fabric.
Figure 5:
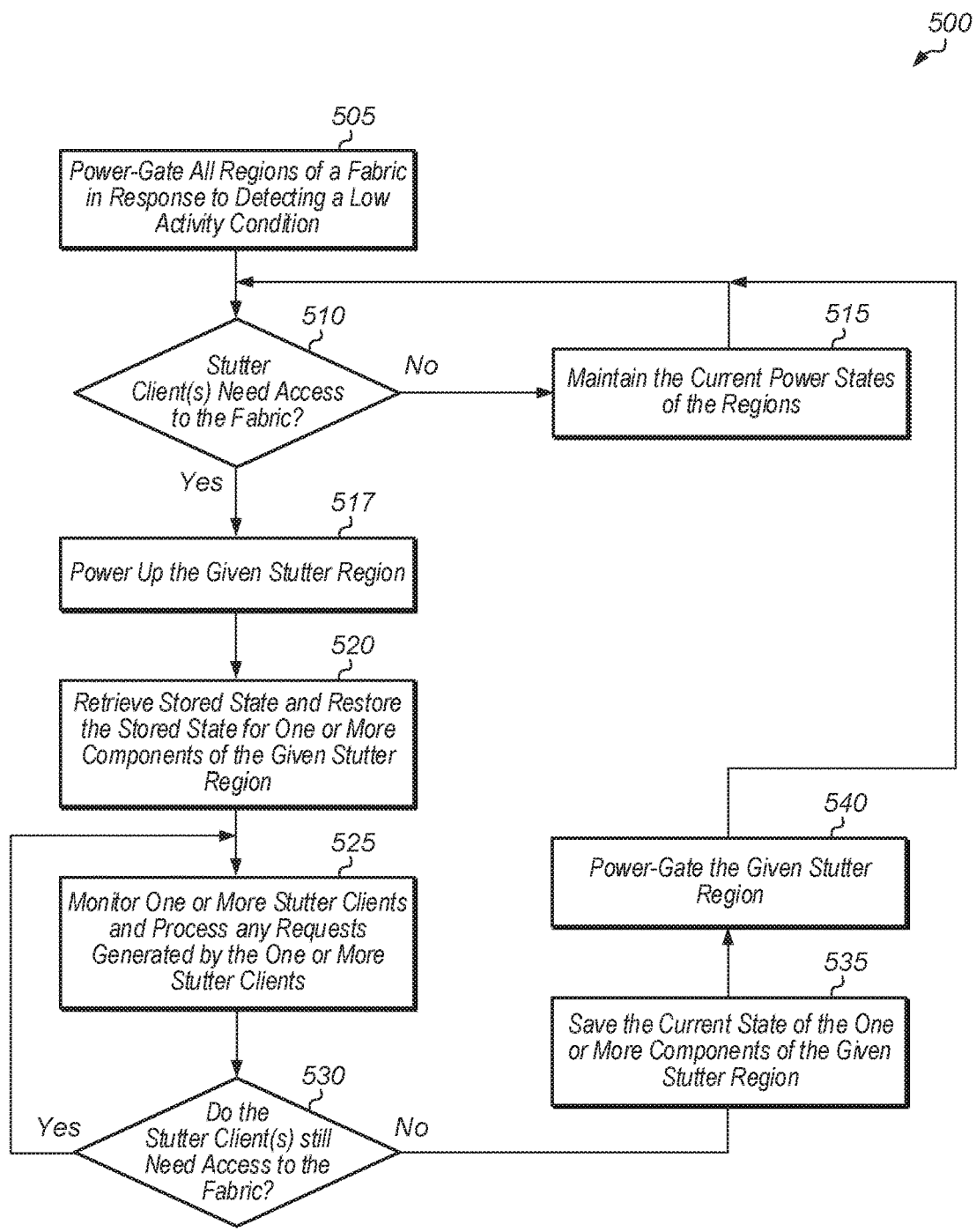
FIG. 5 is a generalized flow diagram illustrating one embodiment of a method for periodically waking up stutter regions of a communication fabric.
Figure 6:
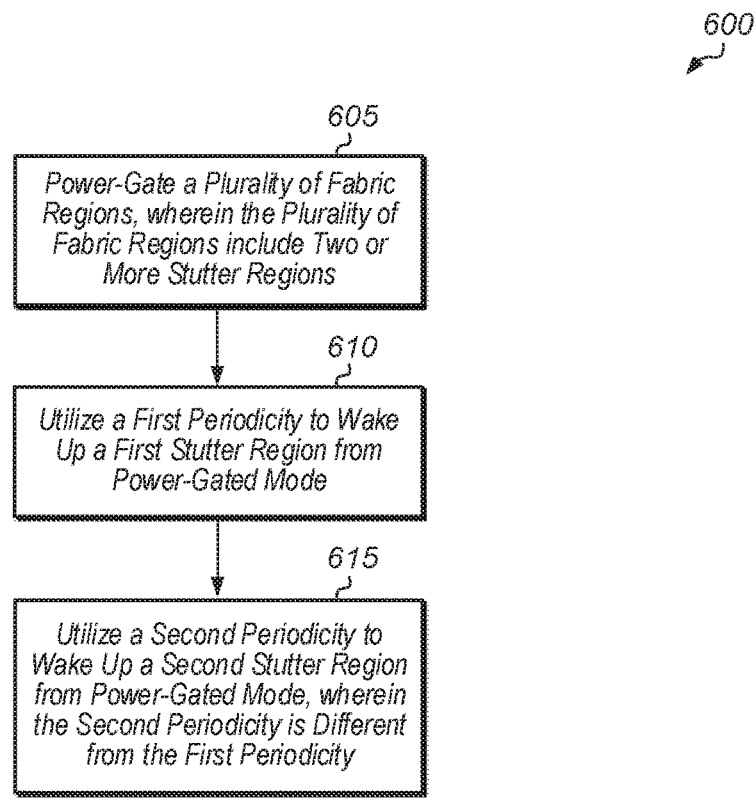
FIG. 6 is a generalized flow diagram illustrating one embodiment of a method for managing different stutter regions of a communication fabric.

Turning now to FIG. 4, one embodiment of a method 400 for implementing a multi-region communication fabric is shown. For purposes of discussion, the steps in this embodiment and those of FIG. 5-6 are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 400.

A system partitions a communication fabric into a plurality of regions, wherein each region of the plurality of regions corresponds to a different power-gating domain (block 405). Each region includes one or more components of the communication fabric. The regions do not need to be contiguous within the communication fabric. For example, a first region includes one or more first components and one or more second components, wherein the first component(s) are in a first area of an integrated circuit which is not contiguous to a second area of the integrated circuit containing the second component(s). The system supplies power to each region of the plurality of regions independently from the other regions (block 410). In other words, the system cycles in and out of power-gating mode for each region independently from the other regions. In one embodiment, the system powers on selected regions on a periodic basis to monitor various clients, with each selected region powered up on a periodicity which is independent of the other regions' periodicity. After block 410, method 400 ends.

Referring now to FIG. 5, one embodiment of a method 500 for periodically waking up stutter regions of a communication fabric is shown. A system power-gates all regions of a fabric in response to detecting a low activity condition for the system (block 505). Stutter and non-stutter regions of the fabric are power-gated in block 505. In one embodiment, the low activity condition can be determining that non-stutter (i.e., unpredictable and/or non-periodic) clients have become idle. In some cases, the fabric can communicate with the stutter clients to cause the stutter clients to go into stutter mode in response to detecting the low activity condition.

After power-gating all fabric regions, the fabric determines if any of the stutter clients need access to the fabric (conditional block 510). In one embodiment, the decision to power up a stutter region in the fabric is based on stutter client demand. For example, if a quality-of-service deadline has been reached based on the status of a buffer, then the fabric will wake up one or more stutter clients to refill the buffer. In another embodiment, timers are used to determine when to wake up different stutter regions, and the fabric determines if a timer has expired for any of the stutter regions of the fabric in conditional block 510. For example, if there is predictable periodicity of a transition between power-gated and powered-on mode due to the processing rate at a stutter client (e.g., pixel rate at monitor for display, video frame rate for playback, audio bitrate), then a timer can be used to bring the corresponding region(s) of the fabric out of power-gated mode. If none of the stutter clients need access to the fabric (conditional block 510, "no" leg), then the fabric maintains the current power states of the regions (block 515). After block 515, method 500 returns to conditional block 510. If a stutter client needs access to the fabric (conditional block 510, "yes" leg), then the fabric powers up a given stutter region corresponding to the stutter client (block 517). The fabric optionally retrieves stored state and restores the stored state for one or more components of the given stutter region (block 520). Then, the given stutter region monitors one or more stutter clients and processes any requests generated by the one or more stutter clients (block 525). If the stutter client(s) no longer need access to the fabric (conditional block 530, "no" leg), then the fabric optionally saves the current state of the one or more components of the given stutter region (block 535). Next, the fabric power-gates the given stutter region (block 540). After block 540, method 500 returns to conditional block 510 to determine if any of the stutter clients need access to the fabric. If the stutter client(s) still need access to the fabric (conditional block 530, "yes" leg), then method 500 returns to block 525.

It is noted that method 500 can be implemented in parallel for multiple different stutter regions which have different periodicities. It is also noted that if a condition for exiting the low activity mode for the system is detected, then this can cause the system to power on all portions of the fabric and then method 500 can end in response to detecting this exit condition. The exit condition can be one of the non-stutter clients waking up and/or generating traffic. This exit condition can be detected at any block within method 500.

Turning now to FIG. 6, one embodiment of a method 600 for managing different stutter regions of a fabric is shown. A plurality of fabric regions are power-gated, wherein the plurality of fabric regions include two or more stutter regions (block 605). The fabric utilizes a first periodicity to wake up a first stutter region from power-gated mode (block 610). When the first stutter region wakes up, the first stutter region monitors one or more stutter clients, connected to the first stutter region, and processes any requests generated by the stutter client(s). Also, the fabric utilizes a second periodicity to wake up a second stutter region from power-gated mode, wherein the second periodicity is different from the first periodicity (block 615). When the second stutter region is woken up, the second stutter region monitors one or more stutter clients. After block 615, method 600 ends. It is noted that the fabric can also wake up one or more other stutter regions with other periodicities.

Figure 7:
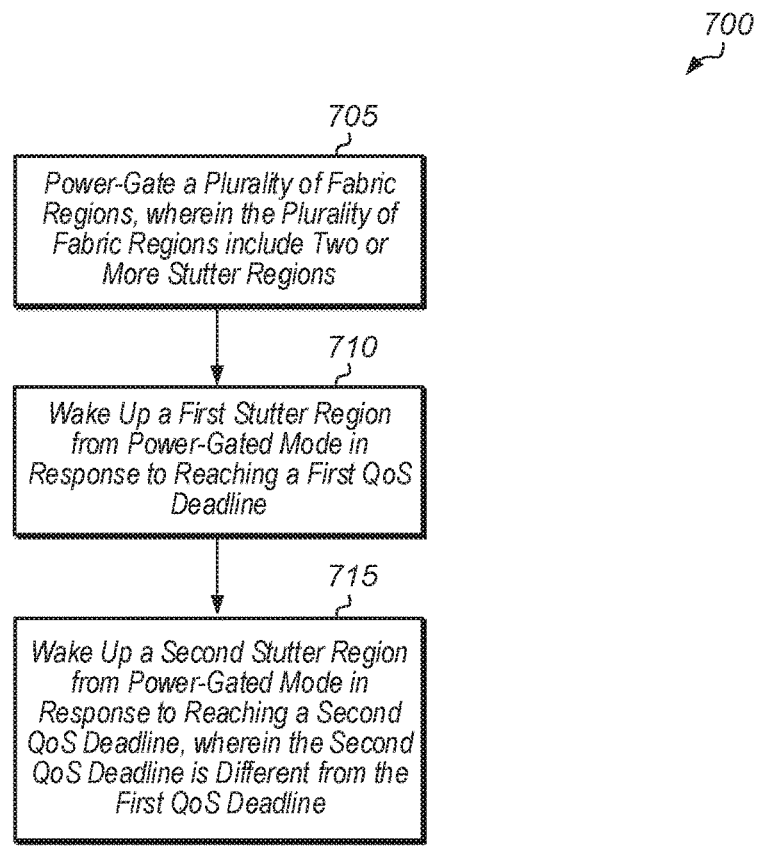
FIG. 7 is a generalized flow diagram illustrating another embodiment of a method for managing different stutter regions of a communication fabric.

Referring now to FIG. 7, another embodiment of a method 700 for managing different stutter regions of a fabric is shown. A plurality of fabric regions are power-gated, wherein the plurality of fabric regions include two or more stutter regions (block 705). The fabric wakes up a first stutter region from power-gated mode in response to reaching a first quality of service (QoS) deadline (block 710). In one embodiment, the first quality of service deadline is reached when the fill status of a first buffer crosses a threshold. In other embodiments, the first quality of service deadline can be based on other factors. Also, the fabric wakes up a second stutter region from power-gated mode in response to reaching a second quality of service deadline, wherein the second quality of service deadline is different from the first quality of service deadline (block 715). In one embodiment, the second quality of service deadline is reached when the fill status of a second buffer crosses a threshold. In other embodiments, the second quality of service deadline can be based on other factors. After block 715, method 700 ends. It is noted that the fabric can also wake up one or more other stutter regions in response to reaching other quality of service deadlines.

In various embodiments, program instructions of a software application are used to implement the methods and/or mechanisms described herein. For example, program instructions executable by a general or special purpose processor are contemplated. In various embodiments, such program instructions can be represented by a high level programming language. In other embodiments, the program instructions can be compiled from a high level programming language to a binary, intermediate, or other form. Alternatively, program instructions can be written that describe the behavior or design of hardware. Such program instructions can be represented by a high-level programming language, such as C. Alternatively, a hardware design language (HDL) such as Verilog can be used. In various embodiments, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
one or more processing units;
one or more memory devices; and
a communication fabric coupled to the one or more processing units and one or more memory devices;
wherein the communication fabric comprises:
a plurality of regions, with each region of the plurality of regions being an independent power-gating domain that is configured to be power-gated independent of other regions of the plurality of regions such that one or more of the plurality of regions may be in a different power state than other regions of the plurality of regions; and
one or more of the plurality of regions comprises local storage configured to store state information corresponding to the one or more of the plurality of regions.

2. The system as recited in claim 1, wherein the system is further configured to power-gate all regions of the plurality of regions of the communication fabric responsive to detecting an indication of low activity.

3. The system as recited in claim 2, wherein the system is further configured to wake up a first region of the communication fabric out of power-gating mode on a first periodic interval to monitor a first processing unit.

4. The system as recited in claim 3, wherein the system is further configured to keep a second region of the communication fabric power-gated while waking up the first region on the first periodic interval.

5. The system as recited in claim 3, wherein the system is further configured to wake up a second region of the communication fabric on a second periodic interval to monitor a second processing unit, wherein the second periodic interval is different from the first periodic interval.

6. The system as recited in claim 1, wherein the state information comprises routing data.

7. The system as recited in claim 1, wherein the communication fabric stores a state of one or more components within a first region of the one or more of the plurality of regions comprising local storage, wherein the communication fabric is configured to restore the state for the one or more components responsive to waking up the first region from power-gated mode.

8. A method comprising:
one or more processing units and one or more memory devices communicating via a communication fabric, wherein the communication fabric comprises:
a plurality of regions, with each region of the plurality of regions being an independent power-gating domain that is configured to be power-gated independent of other regions of the plurality of regions such that one or more of the plurality of regions may be in a different power state than other regions of the plurality of regions; and
one or more of the plurality of regions comprises local storage configured to store state information corresponding to the one or more of the plurality of regions;
managing each region of the communication fabric as a different power-gating domain, whereby each region of the communication fabric may be power-gated independent of one or more other regions.

9. The method as recited in claim 8, further comprising power-gating all regions of the plurality of regions of the communication fabric responsive to detecting an indication of low activity.

10. The method as recited in claim 9, further comprising waking up a first region of the communication fabric out of power-gating mode on a first periodic interval to monitor a first processing unit.

11. The method as recited in claim 10, further comprising keeping a second region of the communication fabric power-gated while waking up the first region on the first periodic interval.

12. The method as recited in claim 10, further comprising waking up a second region of the communication fabric on a second periodic interval to monitor a second processing unit, wherein the second periodic interval is different from the first periodic interval.

13. The method as recited in claim 8, wherein the state information comprises routing data.

14. The method as recited in claim 10, further comprising restoring a stored state for one or more components within the first region responsive to waking up the first region from power-gated mode.

15. An apparatus comprising:
a processing unit;
an input/output (I/O) interface;
a memory; and
a communication fabric coupled to the processing unit, the I/O interface, and the memory, wherein the communication fabric comprises:
a plurality of regions, with each region of the plurality of regions being an independent power-gating domain that is configured to be power-gated independent of other regions of the plurality of regions such that one or more of the plurality of regions may be in a different power state than other regions of the plurality of regions; and
one or more of the plurality of regions comprises local storage configured to store state information corresponding to the one or more of the plurality of regions.

16. The apparatus as recited in claim 15, wherein the apparatus is further configured to power-gate all regions of the plurality of regions of the communication fabric responsive to detecting an indication of low activity.

17. The apparatus as recited in claim 16, wherein the apparatus is further configured to wake up a first region of the communication fabric out of power-gating mode on a first periodic interval to monitor a first processing unit.

18. The apparatus as recited in claim 17, wherein the apparatus is further configured to keep a second region of the communication fabric power-gated while waking up the first region on the first periodic interval.

19. The apparatus as recited in claim 17, wherein the apparatus is further configured to wake up a second region of the communication fabric on a second periodic interval to monitor a second processing unit, wherein the second periodic interval is different from the first periodic interval.

20. The apparatus as recited in claim 15, wherein the state information comprises routing data.

* * * * *